United States Patent [19]
El Hajji

[11] Patent Number: 6,038,187
[45] Date of Patent: Mar. 14, 2000

[54] PROCESS FOR CONTROLLING A MEMORY-PLANE REFRESH OF A DYNAMIC RANDOM-ACCESS MEMORY AND CORRESPONDING RANDOM-ACCESS MEMORY DEVICE

[75] Inventor: Noureddine El Hajji, Grenoble, France

[73] Assignee: STMicroelectronics S.A., Gentilly, France

[21] Appl. No.: 09/251,963

[22] Filed: Feb. 17, 1999

[51] Int. Cl.[7] .................................................. G11C 7/00
[52] U.S. Cl. ...................... 365/222; 365/203; 365/205; 365/210
[58] Field of Search ................................. 365/222, 210, 365/203, 205, 207, 208

[56] References Cited

U.S. PATENT DOCUMENTS

| | | | |
|---|---|---|---|
| 4,747,082 | 5/1988 | Minato et al. | 365/222 |
| 5,132,931 | 7/1992 | Koker | 365/210 |
| 5,278,797 | 1/1994 | Jeon et al. | 365/222 |
| 5,562,621 | 10/1996 | Devin et al. | 365/49 |
| 5,652,729 | 7/1997 | Iwata et al. | 365/222 |
| 5,671,180 | 9/1997 | Higuchi | 365/185.21 |
| 5,694,369 | 12/1997 | Abe | 365/210 |
| 5,912,856 | 6/1999 | Lee et al. | 365/226 |
| 5,936,904 | 8/1999 | El Hajji | 365/205 |

*Primary Examiner*—David Nelms
*Assistant Examiner*—Hien Nguyen
*Attorney, Agent, or Firm*—Theodore E. Galanthay; Allen, Dyer, Doppelt, Milbrath & Gilchrist, P.A.

[57] ABSTRACT

A process is for controlling a memory-plane refresh of a dynamic random-access memory. After having selected at least one first reference memory cell structurally similar to the memory cells of the memory plane, to store a first predetermined binary information item therein, the voltage across the terminals of the storage capacitor of this first reference memory cell is compared with a first predetermined reference voltage. When the voltage reaches the reference voltage, a control signal is delivered in response to which the memory plane is refreshed, then the first reference memory cell is again selected in order to refresh its contents.

19 Claims, 6 Drawing Sheets

PROCESS FOR CONTROLLING A MEMORY-PLANE REFRESH OF A DYNAMIC RANDOM-ACCESS MEMORY AND CORRESPONDING RANDOM-ACCESS MEMORY DEVICE

FIELD OF THE INVENTION

The invention relates to dynamic random-access memories (DRAMs) and, more particularly, to their refresh cycle.

BACKGROUND OF THE INVENTION

In contrast to static random-access memories (SRAMs) in which the stored information remains in the memory indefinitely, at least so long as these memories remain powered, dynamic memories have the particular feature of needing a periodic refresh of the stored information. This is so because of stray leakage currents which discharge the storage capacitor of each memory cell (memory point) of the memory plane. Among known memory cells of dynamic random-access memories, mention may be made of the one having two or three transistors, and those having a single transistor for which reading the information furthermore destroys this information. Mention may also be made of the four-transistor memory cells as described in French patent application No. 97 12818 assigned to the assignee of the present invention.

One of the major limitations of a dynamic memory is its power consumption in the inactive mode, that is, when no access is required of this memory either for reading or for writing. In a static memory in the inactive mode, the consumption is limited to the leakage currents of the CMOS circuits; however, in a dynamic memory it is necessary to refresh the memory, even if no read or write operation is requested. It is actually this refresh operation which will generate non-negligible power consumption incompatible with a low-consumption application.

A dynamic memory needs to be refreshed periodically. The refresh period is equal to the information retention time of the elementary memory point. In a dynamic random-access memory, this retention time is a parameter which is specified to correspond to the worst case. In other words, after numerous characterizations (tests, simulations, etc.) the minimum retention time is determined then the refresh of the random-access memory is specified with this minimum time. However, the retention time depends on a number of factors, such as the "process", the supply voltage and, above all, the temperature. The retention time can vary by a factor of 10,000.

The conventional so-called "worst-case" design approaches thus lead to dynamic random-access memories which have non-negligible consumption, in particular, in the inactive mode. The actual operating conditions would in fact lead to a much longer retention time than the one specified.

SUMMARY OF THE INVENTION

In view of the foregoing background, it is therefore an object of the invention to provide a dynamic access memory with reduced power consumption in the inactive mode.

In this regard, the invention proposes to measure the retention time directly in situ from the dynamic memory, and not to use worst-case specifications. The invention therefore provides a process for controlling a memory-plane refresh of a dynamic random-access memory. According to a general characteristic of the invention, after having selected at least a first reference memory cell structurally similar to the memory cells of the memory plane, in order to store a first predetermined binary information item therein, the voltage across the terminals of the storage capacitor of this first reference memory cell is compared with a first predetermined reference voltage. When the voltage across the terminals of the storage capacitor drops because of stray current leakages and the voltage reaches the reference voltage, a control signal is delivered in response to which the memory plane is refreshed. Then the first reference memory cell is again selected to refresh its content.

The reference voltage is generally chosen greater than or equal to the minimum voltage needed for correctly refreshing each cell of the memory plane. This reference voltage depends on the structure adopted for the memory cell as will be readily understood by those skilled in the art. By way of example, when use is made of a four-transistor memory cell of the type described in the aforementioned prior patent application, the reference voltage is chosen greater than or equal to the threshold voltage of a transistor of the memory cell.

However, when use is made of a more conventional memory cell, of the type comprising fewer than four transistors, for example, one or three transistors, the reference voltage is chosen greater than the product of the offset voltage of the sense/restore amplifier generally arranged at the bottom of each column of the memory plane, multiplied by the ratio between the column metallization capacitance of each column of the memory plane and the storage capacitance of the memory cell.

Indeed, in one or other of the non-limiting examples which have just been cited, if the reference voltage is chosen less than this minimum voltage for a correct refresh of each memory point of the memory plane, there is a risk of losing previously stored information for at least some of these memory cells.

Although only a single reference memory cell is in theory necessary, it is nevertheless particularly advantageous to use two reference memory cells. More precisely, according to one embodiment of the invention, at the same time as the first reference memory cell is selected, a second reference memory cell, structurally similar to the first reference memory cell, is selected to store a second predetermined binary information item, different from the first. In other words, if there is a "1" stored in the first reference memory cell, a "0" will be stored in the second reference memory cell, and vice versa. Then, after this selection the voltage across the terminals of the storage capacitor of this second reference memory cell is also compared with the reference voltage. When one or the other of the two voltages reaches the reference voltage, the control signal is delivered and the two reference memory cells are again selected to refresh their respective contents.

This embodiment makes it possible to take into account the not necessarily symmetrical relationship between the retention curve of a logic "1" in memory and that of a logic "0" in memory.

According to one embodiment of the process according to the invention, the reference memory cell or cells are selected during initial access to the memory to use a write operation to store the corresponding predetermined binary information item therein. Furthermore, when the memory plane is refreshed in response to the control signal supplied by the drop in the voltage in the reference memory cell, the decision may nevertheless be taken not to wait for this control signal to refresh the memory plane, and to refresh it more frequently. Given this fact, in any case, the reference memory cell or cells will be selected each time the memory plane is refreshed so as to store the corresponding predetermined binary information item therein, also using a write operation. in other words, the content of each reference cell is refreshed on each refresh of the memory plane, and in practice following this refresh.

The invention also relates to a dynamic random-access memory device, comprising a memory plane, refresh means capable of refreshing the memory plane in response to a refresh signal, and refresh command means capable of delivering the refresh signal and an end-of-refresh signal. By way of example, the refresh signal may be a high-state logic signal while the end-of-refresh signal may include the transition to the low state, for example, of the aforementioned logic signal.

According to a general characteristic of the invention, the dynamic random-access memory device comprises at least a first reference memory structurally similar to the memory cells of the memory plane, as well as commandable select means capable of selecting this first reference memory cell. The dynamic random-access memory according to the invention also includes write means for storing a first predetermined binary information item in the selected first reference memory cell. Also provided are a voltage source, generating a predetermined reference voltage, and comparison means capable of comparing the voltage across the terminals of the storage capacitor of the first reference memory cell with the reference voltage and capable of delivering a control signal to the refresh command means on the basis of the result of the said comparison. The control signal will, for example, be in the low state, that is, inactive, while the voltage across the terminals of the storage capacitor remains higher than the reference voltage, and will change to the high state (active) when this voltage reaches the reference voltage.

The refresh command means then deliver the refresh signal in response to the high-state control signal so as to enable the memory-plane refresh. Furthermore, in response to the end-of-refresh signal, that is, when the memory plane has been refreshed in full, the select means select the first reference memory cell and the write means then refresh its content.

According to a preferred embodiment of the invention, the dynamic random-access memory device comprises a second reference memory cell, structurally similar to the first reference memory cell. The select means are then capable of simultaneously selecting the first and second reference memory cells. The write means are capable of storing a second predetermined binary information item, different from the first, in the second reference cell. The comparison means are capable of comparing the respective voltages across the terminals of the storage capacitors of the first and second reference memory cells with the reference voltage. And, the write means are capable of simultaneously refreshing the content of each reference cell in response to the end-of-refresh signal.

When each memory cell of the memory plane is a four-transistor memory cell of the type described in the aforementioned prior patent application assigned to the present assignee, the reference voltage is chosen greater than or equal to the threshold voltage of an insulated-gate field-effect transistor. This is when each memory cell comprises two memory transistors, both having the same first ratio between their channel width and their channel length, and two access transistors, both having the same second ratio between their channel width and their channel length (the ratio between the first ratio and the second ratio being greater than or equal to one).

According to one embodiment of the invention, the select means allowing the reference memory cell or cells to be selected include an additional wordline, connected to the gate of the access transistor or transistors of each reference cell, as well as one or more command transistors associated with each reference memory cell. These command transistors are permanently on and connected to the sources of the access transistors. Thus, when the reference cell or cells are selected, by the additional wordline in the active state, the corresponding predetermined binary information item is written instantaneously and automatically. These select means furthermore include a command unit delivering an additional select signal on the additional wordline during initial access to the memory and in the presence of the end-of-refresh signal.

BRIEF DESCRIPTION OF THE DRAWINGS

Other advantages and characteristics of the invention will become apparent on inspecting the detailed description of an entirely non-limiting mode of implementation and embodiment, and the appended drawings, in which.

DETAILED DESCRIPTION OF THE PREFERRED EMBODIMENTS

Figure 1:
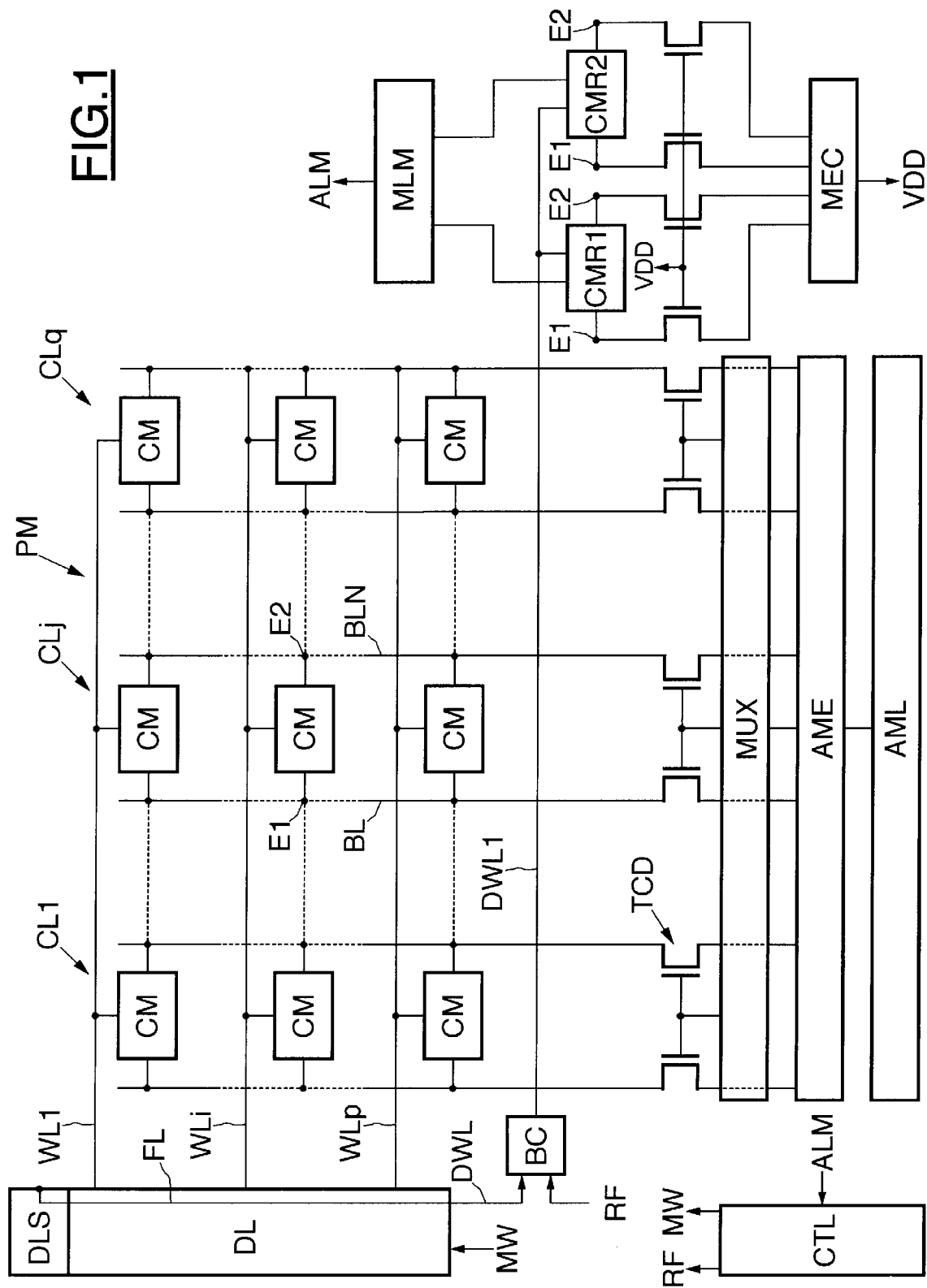
FIG. 1 is a schematic diagram of one embodiment of a dynamic random-access memory device according to the invention.

FIG. 1 represents a dynamic random-access memory device according to the invention, the memory plane PM of which includes a block of memory cells CM organized into lines (rows) and columns. In the example which is described, it is assumed that the memory block has p lines and q columns.

Each memory cell CM has two inputs E1 and E2, respectively connected to two adjacent column metallizations BL and BLN, to receive command voltages for reading and writing the data stored in the memory cell. Furthermore, in conventional fashion, each memory cell is selected by a signal WL carried by a line metallization WL or "wordline". In conventional fashion, the memory device has circuits which are associated with the memory plane PM and are intended to read from, write to, or refresh this memory plane. These circuits include a line decoder DL whose outputs are connected to the various wordlines WLi to deliver the corresponding select signals WLi. A column decoder MUX is also provided, which is associated with command transistors TCD driven in pairs to select one or more columns CLj. Thus, in a read and write phase, the combination of the selection of a wordline WLi and the columns CLj makes it possible to select a memory word of the memory plane, contained in the same wordline. The transistors TCD are also connected in conventional fashion to a write amplifier AME, as well as to a sense amplifier AML, or read circuit, the embodiment of which is known per se.

In addition to the memory plane PM, the memory device according to the invention includes two reference memory cells CMR1 and CMR2, which are structurally identical to the memory cells CM of the memory plane. These two reference memory cells are selected by a signal DWL1 carried by an additional line metallization DWL1, or additional wordline, which is connected to a command unit BC. The structure and function of the command unit BC will be described in further detail below.

This unit BC receives a signal DWL delivered by an additional line decoder DLS which is connected to the command unit BC by a connection FL internal to the line decoder DL. The command unit furthermore receives a refresh signal RF output by the command means CTL. These command means CTL, the embodiment of which is known by those skilled in the art, deliver command words MW to the line decoder DL allowing a particular wordline WLi to be selected in a read or write phase. These command means also command the column decoder MUX to select one or more columns of the memory plane. Furthermore, these command means deliver a refresh signal RF, and receive a control signal ALM from means MLM which are connected to the two reference cells CMR1 and CMR2.

Furthermore, the two input terminals E1 and E2 of each reference cell are connected to write means MEC via two pairs of NMOS (for example) command transistors whose gates are all connected to the supply voltage VDD. Consequently, these four command transistors are permanently on. The result of this is therefore that, as will be seen in more detail below, the selection of these two reference cells CMR1 and CMR2 by the select signal DWL1 allows the write means MEC to automatically write predetermined binary information items to these reference cells.

Before returning in further detail to the role and mode of operation of the command unit BC, the additional line decoder DLS, the reference cells CMR1 and CMR2 and the means MLM and MEC, and the internal operating structure of a memory cell CM of the memory plane will now be described.

The memory cell CM of the memory plane which will be described is a four-transistor cell. This being the case, the invention is not limited to a memory cell of this type, and may be applied to any type of memory cell irrespective of the number of transistors used.

Figure 2:
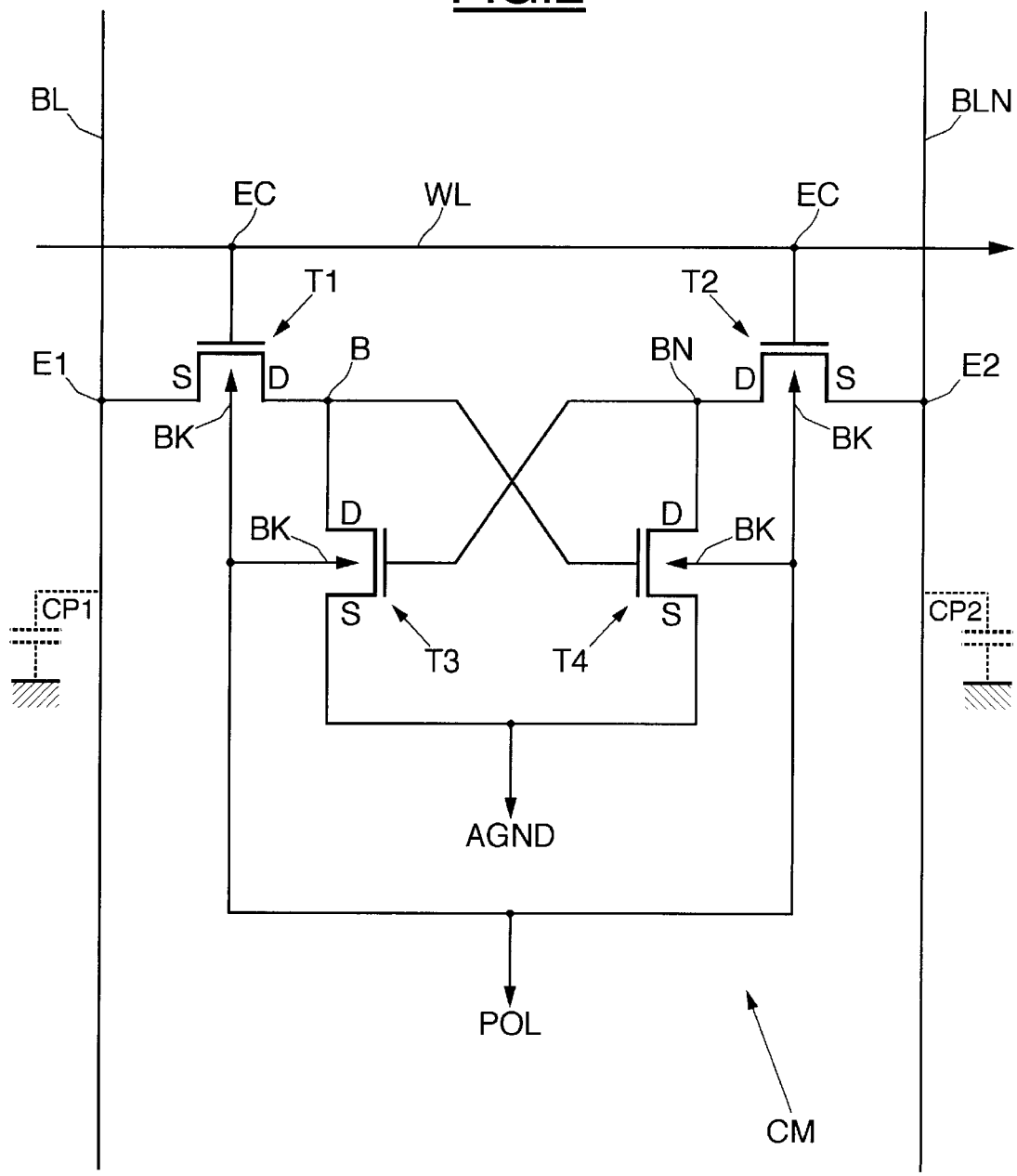
FIG. 2 illustrates further details of the internal architecture of a memory cell of the memory plane of the device of FIG. 1, FIG. 3 schematically illustrates the variation in the voltages across the terminals of a memory cell of this type in the reading phase, in particular.

Each memory cell CM (FIG. 2) has two NMOS access transistors, respectively referenced T1 and T2, whose respective gates are connected to the wordline WL, the corresponding nodes EC thus forming a select input for this memory cell. Further to the two access transistors T1 and T2, the memory cell CM includes two memory NMOS transistors T3 and T4. The capacitor for storing the data in the memory is formed by the gate/source capacitance of a memory transistor. The gate of the transistor T4, as well as the drain of the transistor T3, are connected to the drain of the access transistor T1, the corresponding node being referenced B. Similarly, the gate of the memory transistor T3, as well as the drain of the memory transistor T4, are connected to the drain of the access transistor T2, the corresponding node being referenced BN.

The respective sources and access transistors T1 and T2 are respectively connected to the two command inputs E1 and E2. Lastly, the sources of the two memory transistors T3 and T4 are connected together to a first predetermined bias voltage AGND.

Furthermore, the substrate BK of each transistor of the memory cell, or else the well BK of this transistor if it is in a well, is advantageously connected to a second bias voltage POL. This being the case, it is particularly advantageous for the transistors of the memory cell CM to be arranged in a well (or in a double well) produced within a semiconductor substrate. This embodiment has the advantage of presenting less leakage currents, of being less sensitive to the "noise" originating from the substrate, and of being less sensitive to alpha particles.

To limit the charge losses from the storage capacitors of the memory transistors, and consequently to increase the retention time of a data in memory, the voltages POL and AGND are advantageously chosen so that these voltages satisfy the following relationship:

$$-VT \geq POL-AGND \geq 0$$

in which VT denotes the threshold voltage of the transistors.

This is because a relationship of this type between the voltage POL and the voltage AGND leads to a positive "source-substrate" potential difference which, in view of the "substrate effect" well known to the person skilled in the art, leads to an increase in the threshold voltage and consequently an increase in the retention time.

In the example described above, with a 0.35 micron technology, and a zero voltage AGND, a voltage POL substantially equal to—VDD/10 will be chosen, that is to say substantially equal to—0.3 V.

In the case when the memory cell is produced from PMOS transistors, the bias voltage AGND is then replaced by the bias voltage AVDD, for example, 3 V. In this case, still in order to increase the data retention time by using the "substrate effect", the voltages AVDD and POL will be chosen so that:

$$VDD+VT \leq POL-AVDD \leq 0$$

To illustrate the write operation of the memory cell CM of the line of rank i and the column of rank j, it will be assumed that a logic "1" is intended to be written. The cell CM is selected, on the one hand, by activating the logic signal WLi (WLi=1) from a specific command word and, on the other hand, by selecting the column CLj. Voltages respectively equal to VDD and 0 are then applied to the metallizations BL and BLN of the column CLj.

Since the access transistors T1 and T2 are on, the voltage at the node B is equal to VDD-VT, while the voltage at the node BN is zero. The memory transistor T3 is therefore off, while the memory transistor T4 is on. The logic value "1" is consequently stored in the gate-source capacitance of the transistor T4. It should be noted at this point that, since the transistor T3 is off, the voltage at the node B tends to keep its high value (if, clearly, stray current leaks are neglected). Similarly, since the transistor T4 is on, the voltage at the node BN tends to be kept at its zero level. The person skilled in the art will consequently note the stable nature of the memory cell during the write phase. The signal WL is then deactivated and the data is then considered to have been written.

To write a logic "0", a zero voltage is applied to the metallization BL and a high-level voltage (VDD) is applied to the metallization BLN. It is then the gate-source capacitance of the transistor T3 which stores a charge resulting from the application of the high-level voltage to the node BN.

The mode of operation of the memory cell in the read mode will now be described. It is assumed in the example which will be described that a logic "1" has previously been stored in the memory cell.

Figure 3:
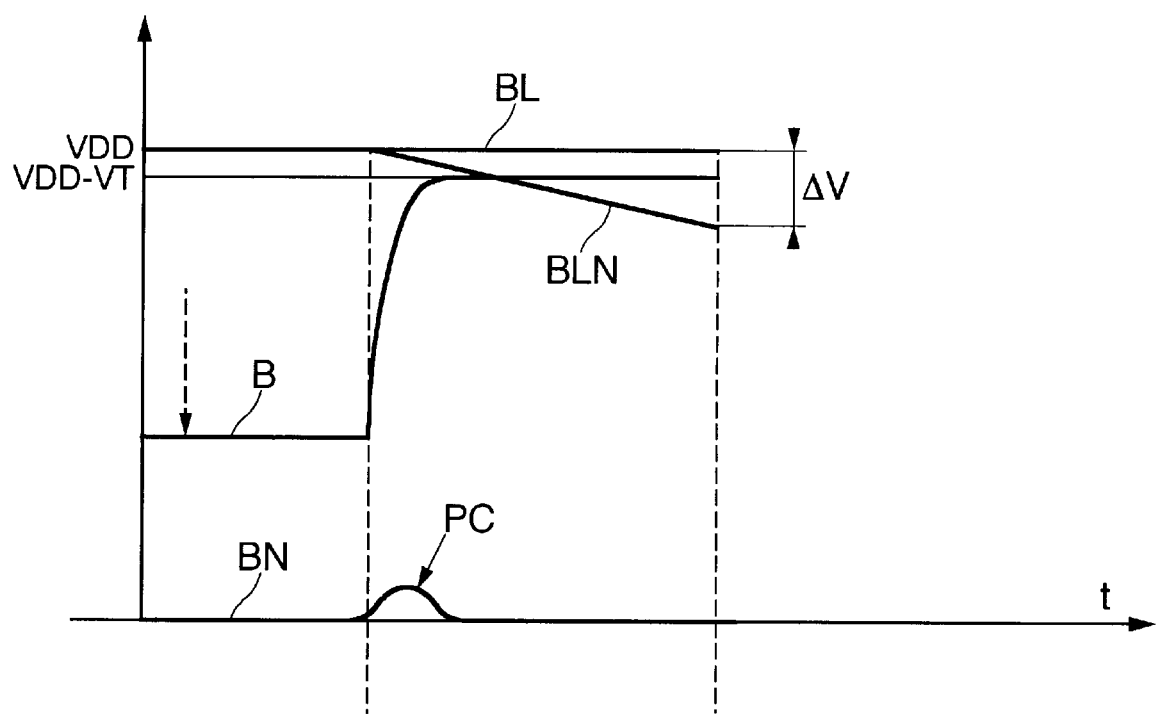

In conventional fashion, the first step includes precharging the metallizations BL and BLN of the column CLj to a high voltage level. The precharge voltage level would be VDD if the precharge circuit contains PMOS transistors, or alternatively VDD−VT if the precharge circuit contains NMOS transistors. It is also assumed that, because of the leaks in the substrate, the potential at the node B has suffered a drop in voltage from the initial level VDD−VT which was applied to it when the logic data was written (FIG. 3).

After the precharge has been deactivated, the line-select signal WLi is activated, the effect of which is to turn on the two access transistors T1 and T2. As a consequence, a charge is immediately transferred from the stray capacitance (column capacitance) CP1 of the metallization BL to the node B, the effect of which is to raise the potential of this node B to its initial value VDD−VT. The transfer time is commensurately shorter if the ratio between the gate/source memory capacitance and the stray capacitance CP1 (or CP2) is small, for example less than 1/50. This memory cell has the remarkable property of seeing the data in memory automatically and substantially immediately refreshed at the start of a read cycle. It is not therefore necessary to provide a specific sense/restore cycle to refresh the data in memory.

Furthermore, after the signal WLi has been activated, there is a decrease in the potential of the metallization BLN with respect to the potential of the metallization BL. This leads to a potential difference ΔV whose sign can be read to determine the logic value of the data stored in the memory cell.

When the signal WLi is activated, a voltage spike is temporarily produced at the node BN. It is important here to prevent this voltage spike from being too great, and, in particular, from it being greater than or equal to the threshold voltage of the memory transistors. This prevents the transistor T3 from being turned on, the effect of which would then be to make the voltage at the node B fall and to turn off the transistor T4. This, in turn, would finally lead to loss of the information in memory, a refresh of the data in the "wrong direction" and consequently the reading of a data with the opposite logic value from the one which was previously written.

This is why it is necessary for the ratio $$R = \frac{W1}{L1} \mid \frac{W2}{L2}$$

to be greater than or equal to 1 and preferably greater than or equal to 2, (W1 and L1 respectively denote the channel width and length of the memory transistors, while W2 and L2 denote the channel width and length of the access transistors).

By way of example, for a 0.35 micron CMOS technology, W1=1.4 micron, L1=0.4 micron, W2=0.8 micron and L2=0.5 micron will preferably be chosen, which leads to a ratio R on the order of 2.2.

The read cycle time for a memory cell of this type is typically on the order of 30 ns, whereas the information refresh time is much shorter, typically on the order of 5 ns for a gate/source memory capacitance on the order of a few femtofarads and a bit line stray capacitance on the order of a few hundreds of femtofarads.

In general, when the ratio between the stray capacitance CP1 (or CP2) of a column metallization BL (or BLN) and the gate/source memory capacitance is high enough, for example in excess of 50, and preferably in excess of 100, the memory cell has the remarkable property of refreshing the data stored in this cell in an extremely short time. This is because the time taken to transfer the charge to the memory capacitor is then very short compared with the discharge time of the stray capacitance of the column metallization.

As seen above, because of leaks in the substrate, the potential at the node B (in the case of writing a logic "1") has suffered a drop in voltage from the initial level which was applied to it when the logic data was written. This voltage drop would have occurred at the node BN if the logic data 0 had been written to the memory cell. This is the reason why it is important to periodically refresh the contents of the memory cells of the memory plane.

According to the invention, this voltage drop will be measured in situ in the integrated circuit, at the two reference cells CMR1 and CMR2. When the voltage drop becomes too great a control signal ALM is delivered indicating to the command means CTL that the memory plane PM should be refreshed. These reference cells CMR1 and CMR2 are strictly identical structurally to the cells CM of the memory plane.

Figure 4:
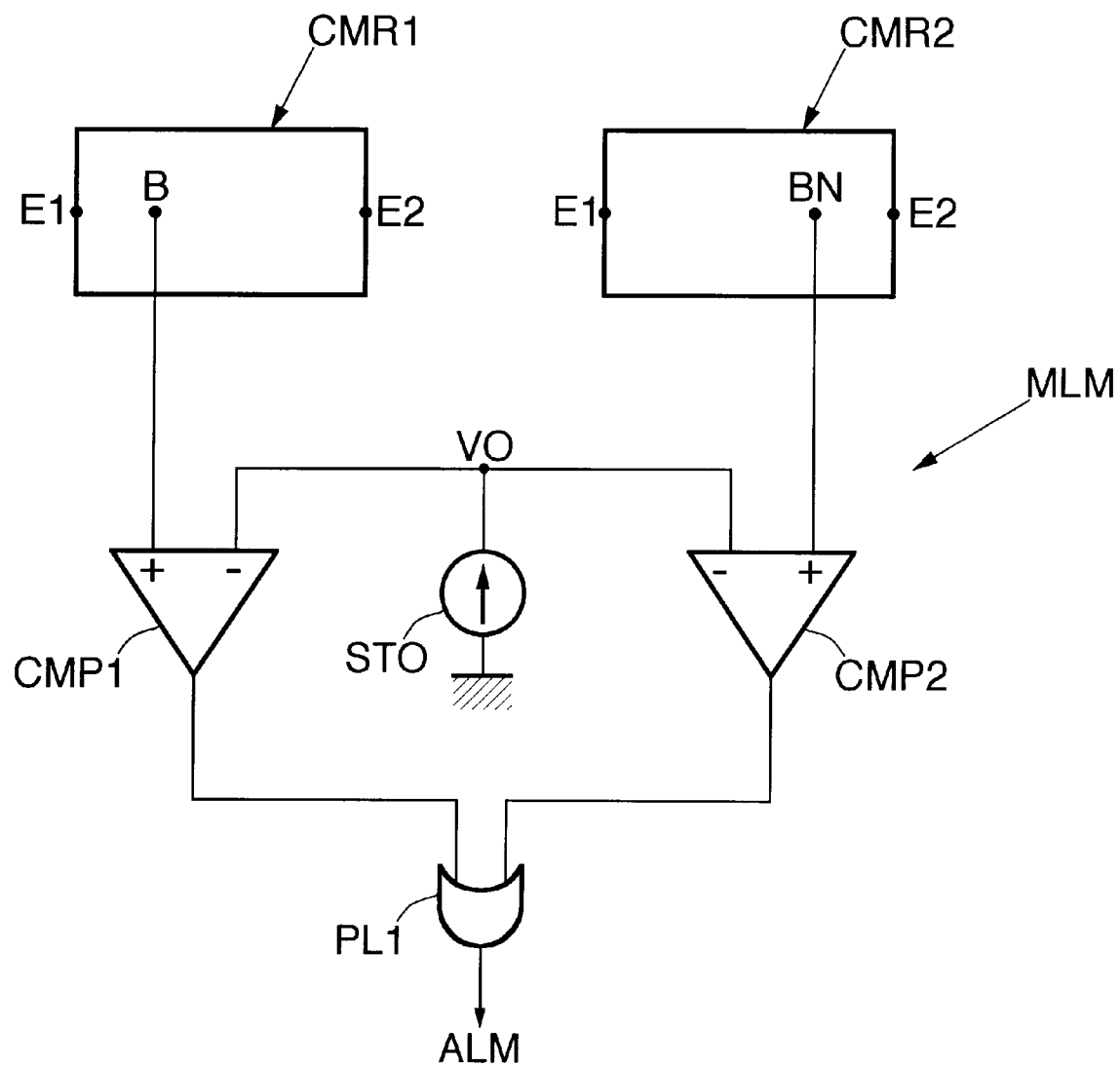
FIG. 4 illustrates further details of the means of the device of FIG. 1 for generating the control signal in response to which the memory plane is refreshed.

Using the write means MEC, the structure of which will be dealt with in further detail below, a write operation similar to the one described for a memory cell CM, is used to store a logic "1" (for example) in the cell CMR1 and a logic "0" in the cell CMR2. Once this writing has been performed, the signal DWL1 is deactivated (access transistors T1 and T2 off and, as regards the cell CMR1, the voltage at the node B is compared in a comparator CMP1 (FIG. 4) with a reference voltage V0 output by a voltage generator STO.

Similarly, as regards the cell CMR2, the voltage at the node BN is compared in a comparator CMP2 with the reference voltage V0. The outputs of these two comparators are connected to the inputs of a logic OR gate, referenced PL1, whose output delivers the control signal ALM.

In other words, by virtue of these means MLM, when one or other of the voltages across the terminals of the respective storage capacitors of the two cells CMR1 and CMR2 reaches the reference voltage V0, the signal ALM changes to the high state (for example). This then indicates that the memory plane should be refreshed.

The reference voltage V0 is chosen greater than or equal to the limit voltage below which there is a risk of incorrectly refreshing the memory cells of the memory plane. This is because if the voltage difference becomes too small between the node B and the node BN, there is a risk of refreshing a memory cell in the wrong direction, that is, of restoring a logic "1" even though a "0" had been previously stored, and vice versa. In the case of the four-transistor memory cell CM described above, the voltage V0 will be chosen greater than or equal to the threshold voltage VT of an NMOS transistor. The situation is different for a memory cell CM containing fewer than four transistors, for example, one containing two or three transistors, and one containing one transistor for which reading the information destroys this information.

For these memories, the refresh is conventionally performed during a sense/restore cycle which, for each column of the memory plane, requires one sense/restore amplification device for each memory cell selected. Conventionally, this sense/restore amplifier comprises two inverters which are looped together (forming a bistable multivibrator). Each is formed by two complementary transistors driven by two successive sense and restore signals.

Conventionally, these two inverters are directly connected together head-to-tail. This may lead to an erroneous refresh of the memory cell if, during reading, the voltage difference between the bit line and the bit line of the column immediately adjacent which serves as a reference, is less than the offset voltage of the sense/restore amplifier. Consequently, for this type of memory cell, a reference voltage V0 will be chosen greater than or equal to the product of the offset of the sense/restore amplifier multiplied by the ratio CP/CS. CP denotes the capacitance of the column metallization of a column of the memory plane (CP1 or CP2) and CS denotes the storage capacitance of the memory cell.

Further the use of such memory cells comprising four transistors has advantages with respect to other types of memory cells, in particular those comprising one transistor and one storage capacitor. As a matter of fact, the comparison of the voltage across the terminals of the storage capacitor with the reference voltage is more difficult for a memory cell having only one transistor, because the input capacity of a comparator is usually much greater than the value of the storage capacitor of the memory cell. By contrast, in a memory cell having four transistors, the gate voltage of one of the memory transistors is directly measured, and the gate voltage only depends on the fact that the access transistor is on or off. Such a measurement is a low impedance measurement which is more reliable than the high impedance measurement made in a memory cell having one transistor.

Figure 5:
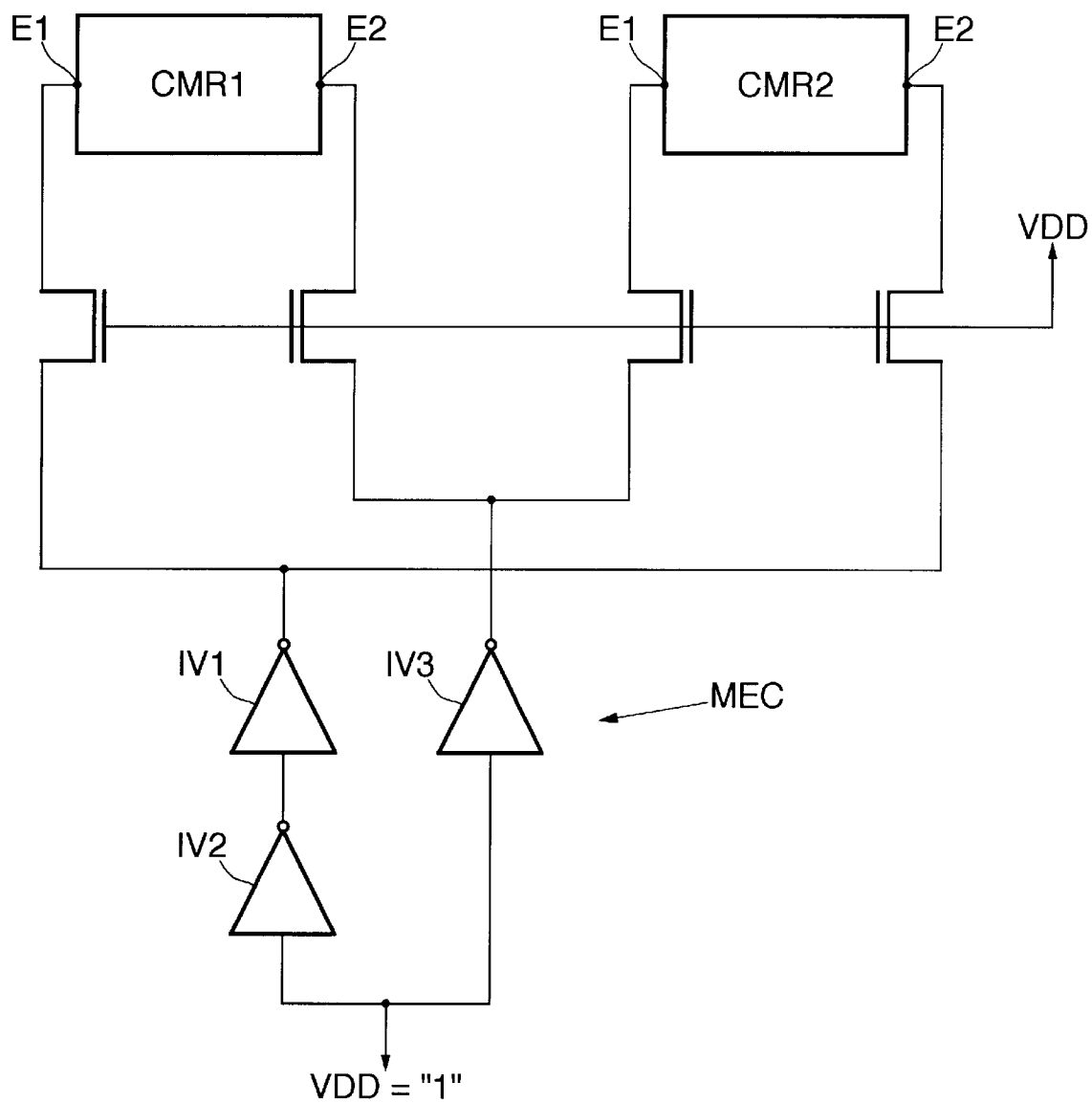
FIG. 5 illustrates further details of the means of the device of FIG. 1 for writing the data to the reference memory cells, and FIG. 6 very schematically illustrates a flow chart for implementation of the process according to the invention.

Now referring more particularly to FIG. 5, it is seen that the write means MEC contain two CMOS inverters in series, IV1 and IV2. These are connected between, on the one hand, the supply voltage VDD and, on the other hand, the node E1 of the cell CMR1 and the node E2 of the cell CMR2. The write means MEC furthermore comprises a third CMOS inverter, IV3, connected between, on the one hand, the supply voltage VDD and, on the other hand, the node E2 of the cell CMR1 and the node E1 of the cell CMR2.

The gates of four command transistors arranged between the reference cells CMR1 and CMR2 and the inverters mentioned above are all connected to the supply voltage VDD, therefore making these four CMOS transistors on. Accordingly, the selection of the two reference cells CMR1 and CMR2 (as a result of the fact that the signal DWL1 changes to the high state) allows automatic and simultaneous application of a voltage VDD to the node E1 of the cell CMR1 and to the node E2 of the cell CMR2, and of a zero voltage to the node E2 of the cell CMR1 and to the node E1 of the cell CMR2. According to the explanations given above, this permits respective storage of a logic "1" in the cell CMR1 and a logic "0" in the cell CMR2.

Figure 6:
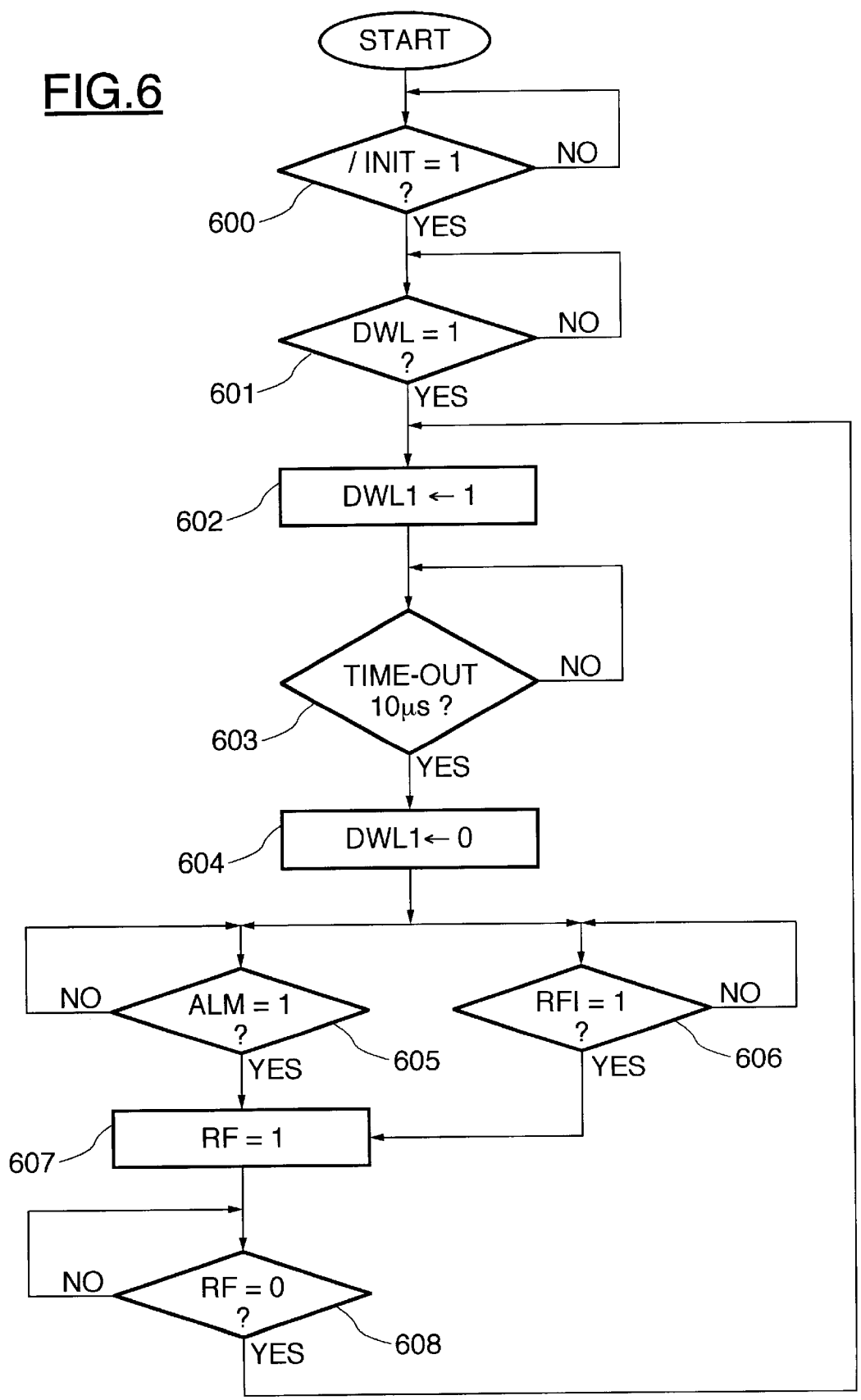

An embodiment of the process according to the invention will now be described with more particular reference to FIG. 6. The device is inactive until an initialization signal/INIT (not INIT) has been received by the memory device (step 600). On reception of this initialization signal, the two reference cells CMR1 and CMR2 will be selected during initial access to the memory, for example during initial write access to at least one of the memory cells CM.

In this regard, the command means CTL deliver a command word MW to the line decoder DL, allowing a particular wordline WLi to be selected. The structure of the additional line decoder DLS is designed in order, on each selection of a line of the memory plane PM, to deliver the additional select signal DWL with a view to activating the additional wordline DWL1. The person skilled in the art will be readily able to produce the circuit DLS from, in particular, OR logic gates. As a consequence, when the signal DWL rises to "1" (step 601), the command unit BC activates the signal DWL1 (step 602) and keeps it activated until a predetermined time-out. The time-out may be,. for example 10 μs (step 603), at the end of which the signal DWL1 returns to the low state (inactive: step 604).

At the end of this step 604, the predetermined information items have been written to the reference cells CMR1 and CMR2, and the voltage drop at the respective nodes B and BN start to be measured. When the control signal ALM changes to the state "1" (step 605), that is, when the voltage at the node B or BN reaches the reference voltage, the command means CTL emit a refresh signal represented by the fact that the signal RF changes to the state "1" (step 607).

The memory plane PM is then refreshed comprehensively in a manner known by those skilled in the art. More precisely, for memory cells of the type with one, two or three transistors, sense/restore cycles are applied. For the four-transistor cell described above, specific refresh pulses of very short duration are delivered on the wordlines WLi. In practice, the pulses may last slightly longer than the time for transferring charge to the memory capacitors, that is, the pulses may last slightly longer than the refresh time for the data in memory (cf. FIG. 3).

When a full refresh of the memory plane has been completed, the command means CTL emit an end-of-refresh signal, here represented by resetting the signal RF to the low state (step 608). In response to this end-of-refresh signal, the command unit BC reactivates the select signal DWL1 (step 602) to select the cells CMR1 and CMR2 and to allow their contents to be refreshed by restoring the predetermined information items which they are to store.

This being the case, in certain applications, it may be necessary to refresh the memory plane more frequently, without waiting for the control signal ALM to rise to "1". In this case, these refreshes may be decided upon internally to the command means CTL by emitting an internal refresh signal RFI (step 606) in response to which the command means CTL activate the signal RF (step 607). The rest of the process is then identical to that which has just been described.

For the sake of simplicity, the logic signals RFI and /INIT have intentionally not been represented in FIG. 1. The person skilled in the art will be readily able to produce the various logic units, and in particular the command unit BC, allowing the flow chart of FIG. 6 to be implemented, for example by using logic synthesis software.

That which is claimed is:

1. A method for controlling a memory-plane refresh of a dynamic random-access memory device, the method comprising the steps of:

selecting at least one first reference memory cell being structurally similar to memory cells of the memory device and comprising a storage capacitor;

after selecting the at least one first reference memory cell, storing a first predetermined binary information item therein by comparing a storage capacitor voltage across the storage capacitor of the at least one first reference memory cell with a first predetermined reference voltage, and delivering a control signal for refreshing the memory plane when the storage capacitor voltage reaches the reference voltage; and selecting the at least one first reference cell again to refresh the contents thereof.

2. A method according to claim 1, further comprising the step of at the same time as selecting the at least one first reference memory cell, selecting at least one second reference memory cell, structurally similar and comprising a storage capacitor, to the at least one first reference memory cell to store a second predetermined binary information item, different from the first, therein.

3. A method according to claim 2, further comprising the step of comparing a storage capacitor voltage across the storage capacitor of the at least one second reference memory cell with the reference voltage, and delivering the control signal when one of the storage capacitor voltages reaches the reference voltage.

4. A method according to claim 3, further comprising the step of selecting the at least one first and second reference memory cells to refresh the respective contents thereof.

5. A method according to claim 1, wherein the step of selecting the at least one first reference memory cell comprises selecting the at least one first reference memory cell during initial access to the memory to use a write operation to store a corresponding predetermined binary information item therein.

6. A method according to claim 5, further comprising the step of selecting the at least one first reference memory cell each time the memory plane is refreshed to store the corresponding predetermined binary information item therein using a same write operation.

7. A method for controlling a memory-plane refresh of a dynamic random-access memory device, the method comprising the steps of:

selecting at least one first reference memory cell being structurally similar to memory cells of the memory device and comprising a storage capacitor;

after selecting the at least one first reference memory cell, storing a first predetermined binary information item therein by comparing a storage capacitor voltage across the storage capacitor of the at least one first reference memory cell with a first predetermined reference voltage, and delivering a control signal for refreshing the memory plane when the storage capacitor voltage reaches the reference voltage;

selecting the at least one first reference cell again to refresh the contents thereof; and selecting the at least one first reference memory cell each time the memory plane is refreshed to store the corresponding predetermined binary operation therein using a same write operation.

8. A method according to claim 7, further comprising the step of at the same time as selecting the at least one first reference memory cell, selecting at least one second reference memory cell, structurally similar to the at least one first reference memory cell and comprising a storage capacitor, to store a second predetermined binary information item, different from the first, therein.

9. A method according to claim 8, further comprising the step of comparing a storage capacitor voltage across the storage capacitor of the at least one second reference memory cell with the reference voltage, and delivering the control signal when one of the storage capacitor voltages reaches the reference voltage.

10. A method according to claim 9, further comprising the step of selecting the at least one first and second reference memory cells to refresh the respective contents thereof.

11. A dynamic random-access memory device, comprising a memory plane comprising memory cells;

a refresh circuit for refreshing the memory plane in response to a refresh signal, said refresh circuit comprising a refresh command circuit for delivering the refresh signal and an end-of-refresh signal;

at least one first reference memory cell structurally similar to memory cells of the memory plane and comprising a storage capacitor;

a selection circuit for selecting the at least one first reference memory cell;

a write circuit for storing a first predetermined binary information item in the selected at least one first reference memory cell;

a voltage source generating a predetermined reference voltage; and a comparator for comparing a voltage across the storage capacitor of the at least one first reference memory cell with the reference voltage and for delivering a control signal to said refresh command circuit responsive to the comparison;

said refresh command circuit delivering the refresh signal in response to the control signal;

said selection circuit selecting the at least one first reference memory cell and the write circuit refreshing the contents of the selected at least one first reference memory cell in response to the end-of-refresh signal.

12. A dynamic random-access memory device according to claim 11, further comprising at least one second reference memory cell structurally similar to the first reference memory cell; and wherein said selection circuit simultaneously selects the at least one first and second reference memory cells.

13. A dynamic random-access memory device according to claim 12 wherein said write circuit stores a second predetermined binary information item, different from the first, in the at least one second reference cell.

14. A dynamic random-access memory device according to claim 13, wherein said comparator compares respective voltages across the terminals of the storage capacitors of the at least one first and second reference memory cells with the reference voltage; and wherein said write circuit refreshes contents of each of the at least one first and second memory reference cells responsive to the end-of-refresh signal.

15. A dynamic random-access memory device according to claim 11, wherein each memory cell of the memory plane comprises four insulated-gate field-effect transistors comprising two memory transistors both having a same first ratio between channel width and channel length, and two access transistors both having a same second ratio between channel width and channel length.

16. A dynamic random-access memory device according to claim 15, wherein a ratio between the first ratio and the second ratio is greater than or equal to one, and wherein reference voltage is greater than or equal to a threshold voltage of a transistor.

17. A dynamic random-access memory device according to claim 11, wherein each memory cell of the memory plane comprises fewer than four transistors.

18. A dynamic random-access memory device according to claim 17, further comprising a sense/restore amplifier associated with each column of the memory plane; and wherein the reference voltage is greater than a product of an offset voltage of the sense/restore amplifier multiplied by a ratio between a column metallization capacitance of each column of the memory plane and a storage capacitance.

19. A dynamic random-access memory device according to claim 11, wherein said selection circuit comprises:

at least one access transistor;

an additional wordline connected to a gate of the at least one access transistor;

at least one command transistor associated with the at least one reference memory cell, permanently on and connected to a source of the at least one access transistor; and a command unit delivering a select signal on the additional wordline during initial access to the memory and in the presence of the end-of-refresh signal.

* * * * *

UNITED STATES PATENT AND TRADEMARK OFFICE
CERTIFICATE OF CORRECTION

PATENT NO. : 6,038,187  
APPLICATION NO. : 09/251963  
DATED : March 14, 2000  
INVENTOR(S) : Noureddine El Hajji Page 1 of 1

It is certified that error appears in the above-identified patent and that said Letters Patent is hereby corrected as shown below:

Title page, item  
{30} Foreign Applications     Insert: -- February 25, 1998   [FR]   France 99 02281 --

Column 6, Line 19     Strike: "$VT \geq POL-AGND \geq 0$"  
                     Insert: -- $-VT \leq POL-AGND \leq 0$ --

Column 6, Line 39     Strike: "$VDD+VT \leq POL-AVDD \leq 0$"  
                     Insert: -- $VDD+VT \geq POL-AVDD \geq 0$ --

Column 8, Line 20     Strike: "," between "these" and "reference"

Column 10, Line 1     Strike "." (Period) after "be"

Signed and Sealed this

Nineteenth Day of February, 2008

JON W. DUDAS  
*Director of the United States Patent and Trademark Office*